United States Patent
Kaneko (10) Patent No.: US 12,019,275 B2
(45) Date of Patent: Jun. 25, 2024

(54) INTEGRATED OPTICAL MODULE

(71) Applicant: Mitsubishi Electric Corporation, Tokyo (JP)

(72) Inventor: Shinichi Kaneko, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 205 days.

(21) Appl. No.: 17/757,433

(22) PCT Filed: Feb. 21, 2020

(86) PCT No.: PCT/JP2020/007023
§ 371 (c)(1),
(2) Date: Jun. 15, 2022

(87) PCT Pub. No.: WO2021/166216
PCT Pub. Date: Aug. 26, 2021

(65) Prior Publication Data
US 2023/0022318 A1 Jan. 26, 2023

(51) Int. Cl.
*G02B 6/293* (2006.01)
*G02B 6/42* (2006.01)
(Continued)

(52) U.S. Cl.
CPC ..... *G02B 6/29367* (2013.01); *G02B 6/29364* (2013.01); *G02B 6/2938* (2013.01);
(Continued)

(58) Field of Classification Search
CPC ............ G02B 6/29364; G02B 6/29367; G02B 6/2938; G02B 6/4215; G02B 6/4292; H01S 5/022; H01S 5/40
See application file for complete search history.

(56) References Cited

U.S. PATENT DOCUMENTS 8,830,587 B2 * 9/2014 Bhatia .................. G02B 6/4204
359/590
9,197,345 B2 * 11/2015 Nakajima ............ G02B 6/4215
(Continued)

FOREIGN PATENT DOCUMENTS

CN 109375315 A 2/2019
JP 2003-209313 A 7/2003
(Continued)

OTHER PUBLICATIONS

International Search Report issued in PCT/JP2020/007023; mailed Apr. 21, 2020.
(Continued)

*Primary Examiner* — Ryan A Lepisto
(74) *Attorney, Agent, or Firm* — Studebaker & Brackett PC (57) ABSTRACT

Provided here are: a mounting section having a light-emitting element for emitting an optical signal; a mounting section arranged alongside the mounting section and having a light-emitting element for emitting an optical signal that is different in wavelength from the optical signal; and an optical multiplexer having a filter for transmitting therethrough only the wavelength of the optical signal, a mirror for reflecting the optical signal transmitted through the filter, and a filter arranged alongside the filter, for transmitting therethrough only the wavelength of the optical signal, and for reflecting the optical signal reflected by the mirror and multiplexing it with the transmitted optical signal; wherein the light-emitting element is mounted in the mounting section to be displaced toward the light-emitting element from a center in a width direction across an emission direction of the optical signal.

7 Claims, 10 Drawing Sheets

(51) Int. Cl.
*H01S 5/022* (2021.01)
*H01S 5/40* (2006.01)

(52) U.S. Cl.
CPC ......... *G02B 6/4215* (2013.01); *G02B 6/4292* (2013.01); *H01S 5/022* (2013.01); *H01S 5/40* (2013.01)

(56) References Cited

U.S. PATENT DOCUMENTS

| | | | | |
|---|---|---|---|---|
| 9,350,454 | B2* | 5/2016 | Xu | H04B 10/506 |
| 10,007,065 | B2* | 6/2018 | Tan | G02B 6/4215 |
| 10,090,934 | B2* | 10/2018 | Hara | H04B 10/67 |
| 10,333,646 | B2* | 6/2019 | Tian | H04B 10/503 |
| 10,725,253 | B2* | 7/2020 | Yamashita | G02B 6/29307 |
| 10,924,185 | B2* | 2/2021 | Leigh | H04J 14/0216 |
| 11,256,034 | B2* | 2/2022 | Murao | G02B 6/4246 |
| 11,360,266 | B2* | 6/2022 | Kaneko | G02B 5/08 |
| 11,668,947 | B2* | 6/2023 | Li | G02B 6/29367 359/634 |
| 2003/0152338 | A1 | 8/2003 | Kuhara et al. | |
| 2003/0174753 | A1 | 9/2003 | Yabuki et al. | |
| 2003/0190124 | A1 | 10/2003 | Kuhara | |
| 2005/0163420 | A1 | 7/2005 | Kuhara | |
| 2012/0328229 | A1 | 12/2012 | Kogo et al. | |
| 2014/0133862 | A1* | 5/2014 | Fujimura | H04J 14/02 398/79 |
| 2017/0212320 | A1 | 7/2017 | Hara | |
| 2018/0123695 | A1 | 5/2018 | Kubota et al. | |

FOREIGN PATENT DOCUMENTS

| | | |
|---|---|---|
| JP | 2003-232944 A | 8/2003 |
| JP | 2003-294964 A | 10/2003 |
| JP | 2013-008887 A | 1/2013 |
| JP | 2017-135194 A | 8/2017 |
| JP | 2018-072674 A | 5/2018 |
| WO | 2018/008154 A1 | 1/2018 |

OTHER PUBLICATIONS

An Office Action mailed by China National Intellectual Property Administration on Jun. 1, 2023, which corresponds to Chinese Patent Application No. 202080096604.4 and is related to U.S. Appl. No. 17/757,433; with English language translation.

* cited by examiner

INTEGRATED OPTICAL MODULE

TECHNICAL FIELD

The present application relates to an integrated optical module.

BACKGROUND ART

In optical transmission systems, in order to cope with the recent rapid increase in communication capacity, a wavelength-multiplex optical transmission method is widely employed in which optical signals are transmitted or received in such a manner that plural wavelength signals are put together in a single optical fiber. The integrated optical module is used for this wavelength-multiplex optical transmission method, and is provided with a plurality of light-emitting elements with different wavelengths and an optical multiplexer for multiplexing plural optical signals emitted from the plurality of light-emitting elements into a single optical fiber, that are incorporated in a common package, and has a function of transmitting these signals while putting them together in the single optical fiber. For example, as represented by an optical module of Patent Document 1, an optical signal is reflected again and again by means of a filter and a mirror, to thereby be multiplexed with an optical signal in another lane, and then these optical signals are emitted from the optical multiplexer. The optical signals multiplexed and emitted by the optical multiplexer are converged by a condenser lens into a single optical fiber, and are then emitted in a state transmittable to a fiber optic transmission network, from the integrated optical module.

In order to attain a large-capacity optical transmission system, it is required that many integrated optical modules be mounted in a transmission device, so that a small-sized integrated optical module is highly recommended to increase the mounting density. A size of an integrated optical module depends heavily on a size of its holder that is largest among the members incorporated in a package. Among sizes of the holder, the lengthwise size (a size in an optical-signal traveling direction) is determined depending on the interval between the light-emitting elements. This is because, at the time of multiplexing the optical signals, although the optical signal travels while being reflected between a filter and a mirror that are adhered to the holder, this optical signal has to be placed at a position same as that of the other optical signal in an adjacent lane, at the time of reaching a filter of the adjacent lane after being reflected by the mirror. Accordingly, when the interval between the light-emitting elements becomes large, it is required to increase the length of the holder so that the optical signal may be re-positioned at the same position of the optical signal in the adjacent lane. Meanwhile, in accordance with the enhanced performance and reduced power consumption of the integrated optical module, not only the light-emitting element but also other components such as a monitor, a capacitor, etc. have come to be mounted together on a mounting board for the light-emitting element. Thus, the mounting board is enlarged and this causes increase of the interval between the light-emitting elements.

CITATION LIST

Patent Document

Patent Document 1: Japanese Patent Application Laid-open No. 2018-72674 (Paragraph 0015; FIG. 4)

SUMMARY OF THE INVENTION

Problems to be Solved by the Invention

Accordingly, the conventional integrated optical module has a problem that, in accordance with the enhanced performance and reduced power consumption thereof that are associated with the recent rapid increase in communication capacity, the mounting board is enlarged thus causing increase of the interval between the light-emitting elements, so that the optical multiplexer as well as the holder is enlarged and thus the integrated optical module is also enlarged.

This application discloses a technique for solving the problem as described above, and an object thereof is to provide a small-sized integrated optical module due to reduction in size of the optical multiplexer.

Means for Solving the Problems

An integrated optical module disclosed in this application is characterized by comprising: a first mounting section having a first light-emitting element for emitting from a first light-emitting spot thereof, a first optical signal; a second mounting section arranged alongside the first mounting section and having a second light-emitting element for emitting from a second light-emitting spot thereof, a second optical signal whose wavelength is different from that of the first optical signal; a first collimating lens for transforming the first optical signal emitted from the first light-emitting spot, into parallel light; a second collimating lens for transforming the second optical signal emitted from the second light-emitting spot, into parallel light; and an optical multiplex section having a first filter for transmitting therethrough only the wavelength of the first optical signal transformed into parallel light by the first collimating lens; a front-side mirror for reflecting the first optical signal transmitted through the first filter; and a second filter arranged alongside the first filter, for transmitting therethrough only the wavelength of the second optical signal transformed into parallel light by the second collimating lens, and for reflecting the first optical signal reflected by the front-side mirror and multiplexing it with the transmitted second optical signal;

wherein the first light-emitting element is mounted in the first mounting section so as to be displaced from its center in a width direction across an emission direction of the first optical signal, toward the second light-emitting element; and the second light-emitting element is mounted in the second mounting section so as to be displaced from its center in a width direction across an emission direction of the second optical signal, toward the first light-emitting element.

Effect of the Invention

According to this application, since the adjacent light-emitting elements are paired and mounted on their respective mounting boards so as to be closer to each other, it becomes possible to reduce the size of the optical multiplexer. Thus, it is also possible to achieve reduction in size of the integrated optical module in which the optical multiplexer is incorporated.

MODES FOR CARRYING OUT THE INVENTION

Embodiment 1

Figure 1:
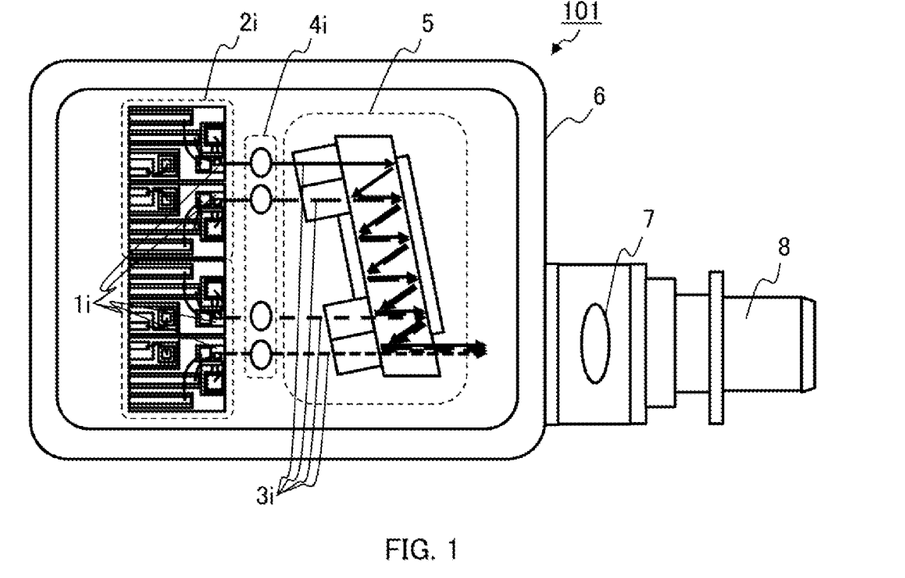
FIG. 1 is a schematic view showing an entire structure of an integrated optical module according to Embodiment 1.
Figure 2:
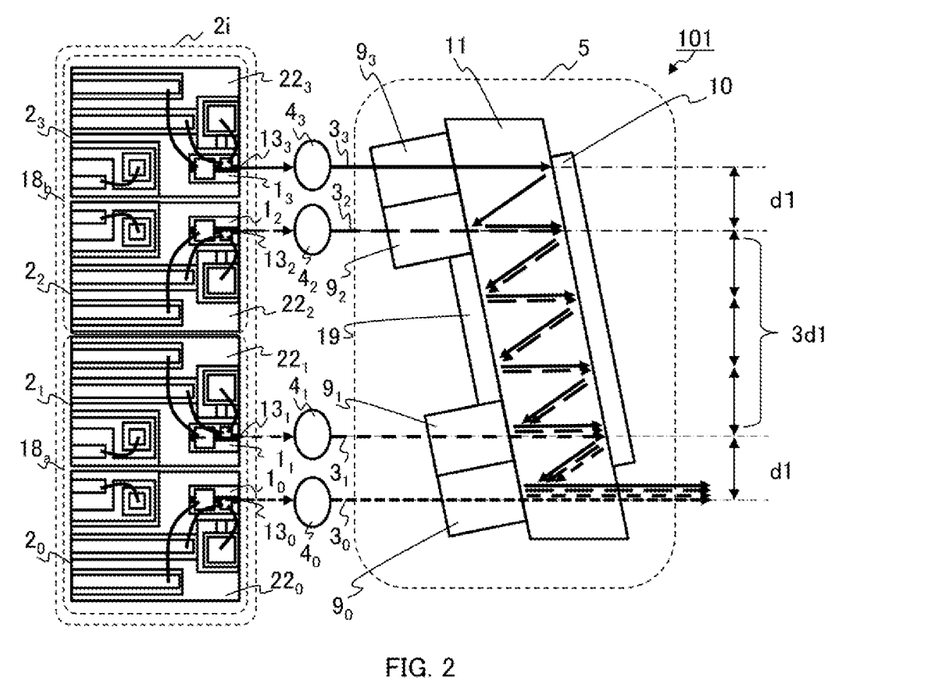
FIG. 2 is a plan view showing an internal configuration of the integrated optical module according to Embodiment 1.
Figure 3:
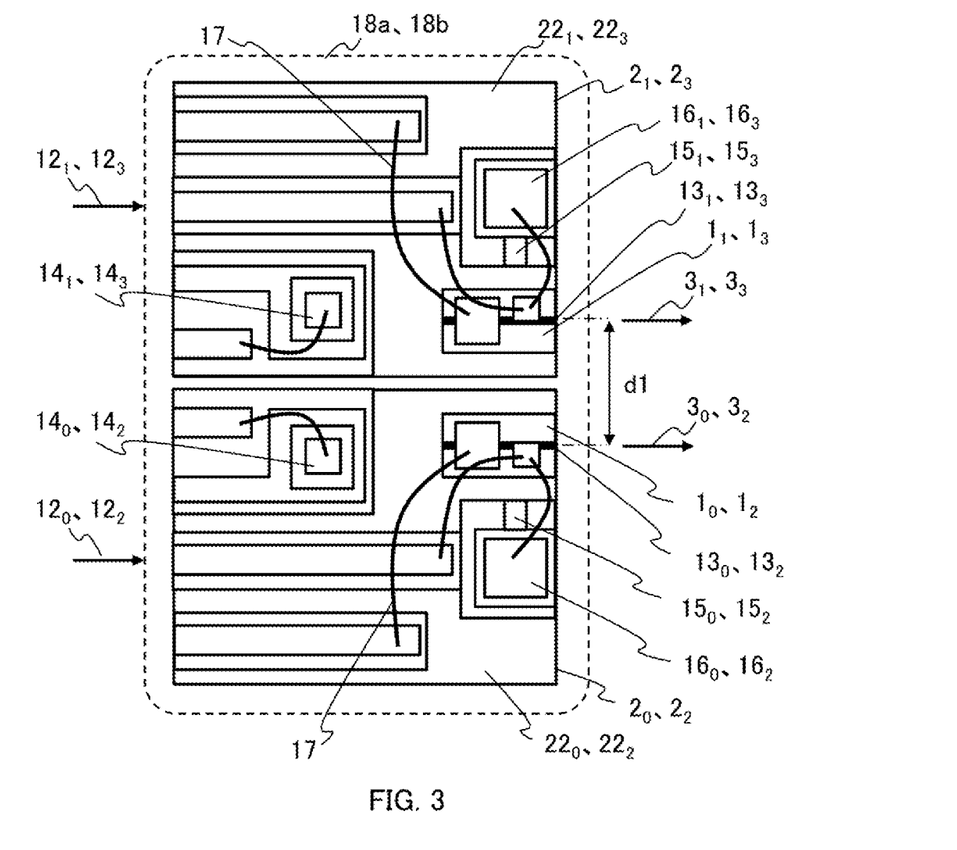
FIG. 3 is a plan view showing a configuration of mounting sections in the integrated optical module according to Embodiment 1.

FIG. 1 is a schematic view showing an entire structure of an integrated optical module 101 according to Embodiment 1. FIG. 2 is a plan view showing an internal configuration of the integrated optical module 101. FIG. 3 is a plan view showing a configuration of mounting sections in the integrated optical module 101.

As shown in FIG. 1, the integrated optical module 101 according to Embodiment 1 is configured with: each mounting section $2i$ in which a light-emitting element $1i$ for converting an electric signal into an optical signal $3i$ is installed; each collimating lens $4i$ for transforming the optical signal $3i$ emitted from the light-emitting element $1i$ into parallel light; an optical multiplexer 5 for multiplexing each optical signal $3i$; a package 6 in which the foregoing components are accommodated; an optical fiber 8; and a condenser lens 7 for converging emitted light from the optical multiplexer into the optical fiber 8. Note that the suffix i represents each number that indicates a lane number (channel number) in the integrated optical module, and is given as 0, 1, 2 or 3 in this embodiment (i=0, 1, 2, 3).

As shown in FIG. 2, the optical multiplexer 5 is configured with: each filter $9i$ for transmitting therethrough an optical signal $3i$ having a wavelength corresponding to the lane i and reflecting optical signals having wavelengths other than that wavelength; a mirror 10 located on a side opposite to the filter $9i$, as a front-side mirror for reflecting optical signals having any wavelengths; a mirror 19 located on the filter $9i$-side and between the filter $9_1$ and the filter $9_2$, as a back-side mirror; and a holder 11 having two parallel surfaces on which the filter $9i$ and the mirrors 10, 19 are fixed. The mirrors 10, 19 are each formed in such a manner that a dielectric multi-layer film is vapor-deposited on a glass substrate.

As shown in FIG. 3, the mounting section $2i$ has: a light-emitting spot $13i$ of the light-emitting element $1i$ at which the optical signal $3i$ corresponding to an electric signal $12i$ emerges; a monitor PD (Photodiode) $14i$ for monitoring an emitted light amount of the light-emitting element $1i$; a terminal resistor $15i$ for applying a voltage to a modulator of the light-emitting element $1i$ in response to the electric signal $12i$; an AC (Alternating Current) coupling capacitor $16i$ for preventing a DC (Direct Current) component in the electric signal $12i$ from flowing to the terminal resistor $15i$ to thereby cause consumption of power; and gold wires 17 for electrically connecting electrodes of the light-emitting element and the monitor PD with electrodes on the mounting board.

With respect to the mounting section $2i$, a pair of the mounting section $2_3$ as a first mounting section and the mounting section $2_2$ as a second mounting section, and a pair of the mounting section $2_1$ as a third mounting section and the mounting section $2_0$ as a fourth mounting section, constitute a light-emitting-element pair 18b as a first light-emitting-element pair and a light-emitting-element pair 18a as a second light-emitting-element pair, respectively. The light-emitting-element pair 18a is a pair of the light-emitting element $1_0$ and the light-emitting element $1_1$ that are adjacent to each other, in which the light-emitting element $1_0$ is mounted on a mounting board $22_0$ so as to be displaced from its center toward the light-emitting element $1_1$, and the light-emitting element $1_1$ is mounted on a mounting board $22_1$ so as to be displaced from its center toward the light-emitting element $1_0$, so that the pair of the adjacent light-emitting elements are mounted on their respective mounting boards so as to be closer to each other. Likewise, the light-emitting-element pair 18b is a pair of the light-emitting element $1_2$ and the light-emitting element $1_3$ that are adjacent to each other, in which the light-emitting element $1_2$ is mounted on a mounting board $22_2$ so as to be displaced from its center toward the light-emitting element $1_3$, and the light-emitting element $1_3$ is mounted on a mounting board $22_3$ so as to be displaced from its center toward the light-emitting element $1_2$, so that the pair of the adjacent light-emitting elements are mounted on their respective mounting boards so as to be closer to each other.

Figure 4:
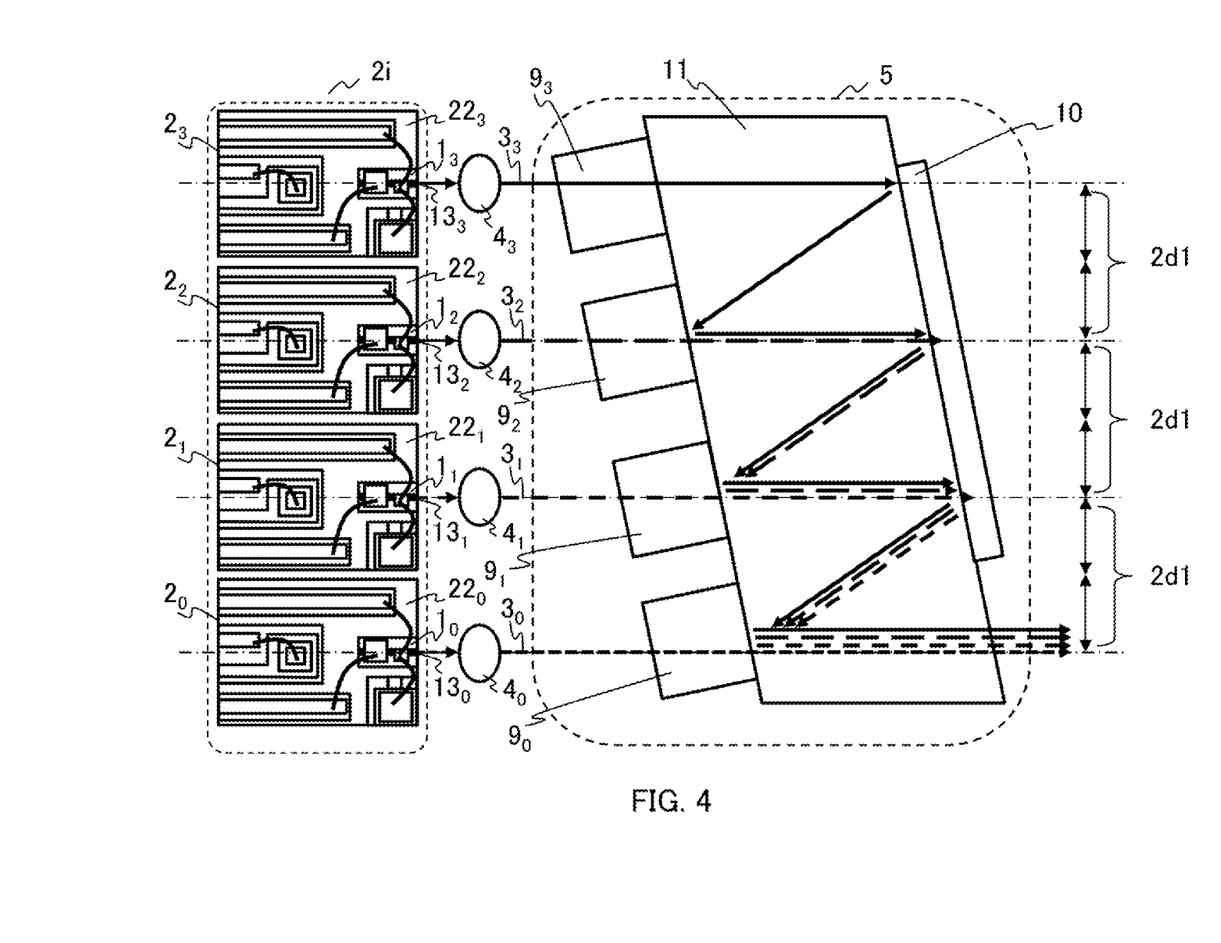
FIG. 4 is a plan view showing an internal configuration of a conventional integrated optical module.

In FIG. 4, a plan view is shown which represents the internal configuration of a conventional integrated optical module. In FIG. 4, for comparison's sake, the size of a mounting section $2i$ is the same as that in the case of Embodiment 1. In Embodiment 1, the light-emitting element $1i$ in each of the light-emitting-element pairs 18a and 18b is mounted so that the light-emitting spot $13i$ of the light-emitting element $1i$ is positioned to be displaced from the center of a conventional mounting board $22i$ in its width direction across the light emission direction, toward the adjacent light-emitting element in that light-emitting-element pair, to the extent of one fourth of the width. In this case, as shown in FIG. 2, when the distance between the light-emitting spots $13_3$, $13_2$ of the respective light-emitting elements $1_3$, $1_2$ in the light-emitting-element pair 18b is assumed to be d1, the distance between the light-emitting spots $13_1$, $13_2$ of the nearby light-emitting element $1_1$ and light-emitting element $1_2$ in the light-emitting-element pair 18a and the light-emitting-element pair 18b, is given as 3d1. Accordingly, the distance between the light-emitting spots $13_0$, $13_3$ of the light-emitting element $1_0$ and the light-emitting element 13 at both ends of the set of the light-emitting-element pair 18a and the light-emitting-element pair 18b, is given as 5d1. In contrast, in the conventional case, as shown in FIG. 4, the distances between the respective light-emitting spots $13i$ of the light-emitting elements $1i$ are each given as 2d1, and thus the distance between the light-emitting spots $13_0$, $13_3$ of the light-emitting element $1_0$ and the light-emitting element $1_3$ in the mounting section $2_0$ and the mounting section $2_3$ at both ends, is given as 6d1.

Figure 5:
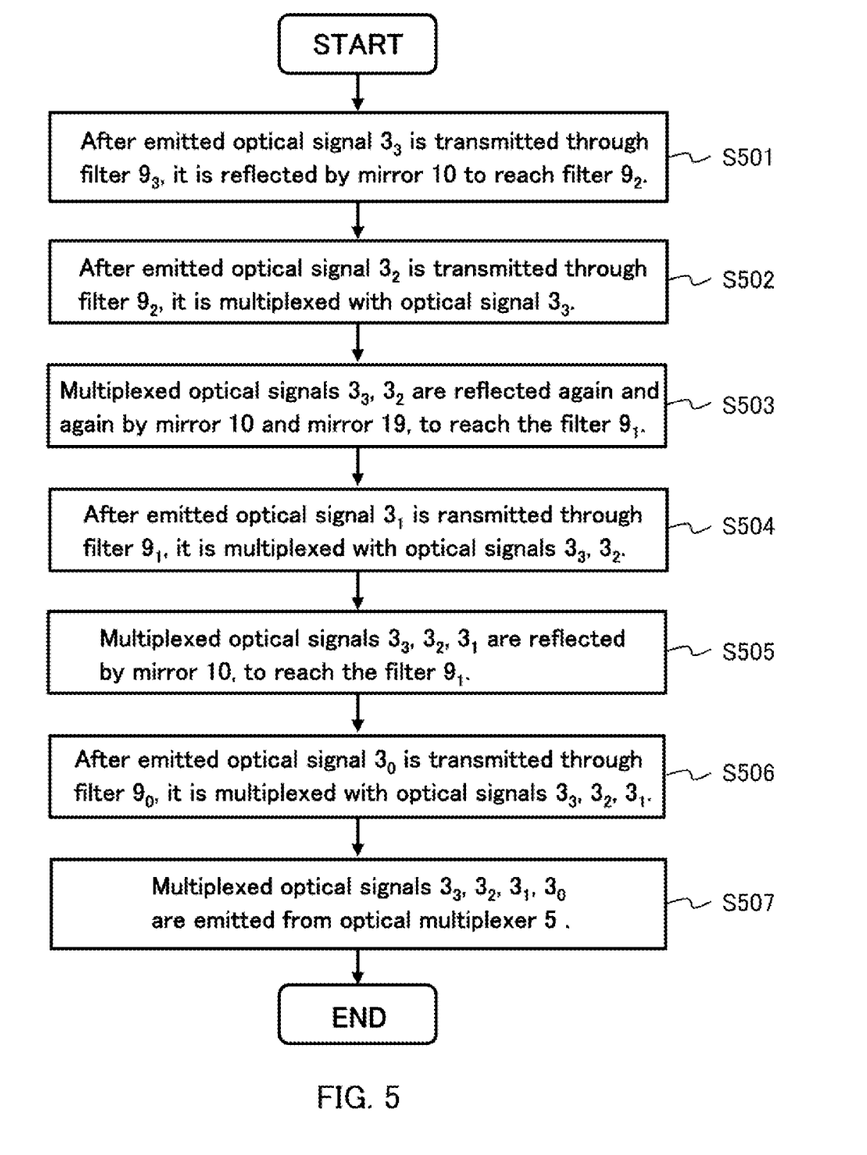
FIG. 5 is a flowchart for illustrating operations of the integrated optical module according to Embodiment 1.

Next, description will be made about operations of the integrated optical module 101 according to Embodiment 1. FIG. 5 is a flowchart for illustrating the operations of the integrated optical module 101.

First of all, the optical signal $3_3$ emitted from the light-emitting element $1_3$ enters into the optical multiplexer 5 after being transformed into parallel light by the collimating lens $4_3$ and is then transmitted through the filter $9_3$, and thereafter, it is reflected by the mirror 10 to reach the filter $9_2$ (Step S501).

Further, the optical signal $3_2$ emitted from the light-emitting element $1_2$ enters into the optical multiplexer 5 after being transformed into parallel light by the collimating lens $4_2$ and is then transmitted through the filter $9_2$, and thereafter, it is multiplexed with the optical signal $3_3$ (Step S502). Here, the length of the holder 11 in the optical-signal propagation direction is designed so that the position of the optical signal $3_3$ having been reflected by the mirror coincides with the position of the optical signal $3_2$ having been transmitted through the filter $9_2$.

Then, the multiplexed optical signals $3_3$, $3_2$ are reflected again and again by the mirror 10 and the mirror 19, to reach the filter $9_1$ (Step S503).

Further, the optical signal $3_1$ emitted from the light-emitting element $1_1$ enters into the optical multiplexer 5 after being transformed into parallel light by the collimating lens $4_1$ and is then transmitted through the filter $9_1$, and thereafter, it is multiplexed with the optical signals $3_3$, $3_2$ (Step S504). Here, when the distance between the light-emitting spots $13_3$, $13_2$ of the respective light-emitting elements $1_3$, $1_2$ in the light-emitting-element pair 18b is assumed to be d1, the distance between the light-emitting spots $13_1$, $13_2$ of the nearby light-emitting element $1_1$ and light-emitting element $1_2$ in the light-emitting-element pair 18a and the light-emitting-element pair 18b, is given as 3d1, so that a position at which the optical signals $3_3$, $3_2$ from the light-emitting elements $1_3$, $1_2$ in the light-emitting-element pair 18b reach the filter $9_1$ (a reflection position) coincides with a position at which the optical signal $3_1$ from the light-emitting element $1_1$ that constitutes the other light-emitting-element pair 18a is transmitted through the filter $9_1$.

Then, the multiplexed optical signals $3_3$, $3_2$, $3_1$ are reflected by the mirror 10, to reach the filter $9_0$ (Step S505).

Further, the optical signal $3_0$ emitted from the light-emitting element $1_0$ enters into the optical multiplexer 5 after being transformed into parallel light by the collimating lens $4_0$ and is then transmitted through the filter $9_0$, and thereafter, it is multiplexed with the optical signals $3_3$, $3_2$, $3_1$ (Step S506). Here, the distance between the light-emitting element $1_0$ and the light-emitting element $1_1$ that constitute the light-emitting-element pair 18a is also given as d1. Thus, a position at which the optical signals $3_3$, $3_2$ from the light-emitting elements $1_3$, $1_2$ in the light-emitting-element pair 18b, as well as the optical signal $3_1$ from the light-emitting element $1_1$ in the light-emitting-element pair 18a, reach the filter $9_0$ (a reflection position) coincides with a position at which the optical signal $3_0$ is transmitted therethrough from the light-emitting spot $13_0$ in the light-emitting element $1_0$ that constitutes the other light-emitting-element pair 18a.

Lastly, the multiplexed optical signals $3_3$, $3_2$, $3_1$, $3_0$ are emitted from the optical multiplexer 5 (Step S507). The optical signals emitted from the optical multiplexer 5 are converged by the condenser lens 7 into the single optical fiber 8, and are then emitted in a state transmittable to a fiber optic transmission network, from the integrated optical module.

As described previously, in order that the optical signals $3i$ are multiplexed, one optical signal is required to get a position that coincides with the position of each of the nearby optical signals, while being reflected again and again by the mirrors 10, 19 and the filter $9i$, so that a length of the holder 11 of the optical multiplexer 5 in the incident direction of the optical signal is given proportionally to a distance between the optical signals.

Accordingly, in Embodiment 1, the distance between the light-emitting spots of the respective adjacent light-emitting elements is d1, which is half the distance 2d1 of the conventional integrated optical module, so that it is possible to reduce to half the length of the holder 11 in the incident direction of the optical signal. Further, with respect also to a width of the holder 11 in the transverse direction across the incident direction of the optical signal, in Embodiment 1, the width from the light-emitting spot $13_0$ to the light-emitting spot $13_3$ is 5d1 even though it is 6d1 in the conventional case, so that it is possible to reduce the size of the optical multiplexer in terms of that width as well.

Figure 6A:
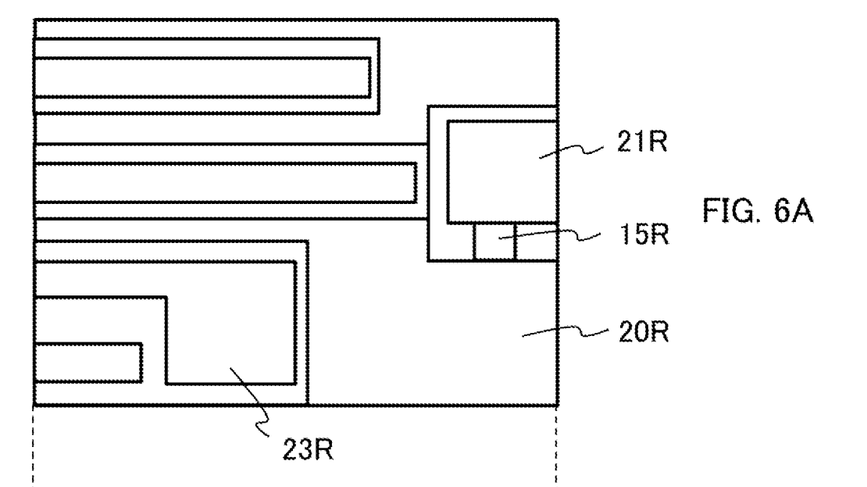
FIG. 6A to FIG. 6C are diagrams for explaining a manufacturing method of mounting sections in the integrated optical module according to Embodiment 1.
Figure 6B:
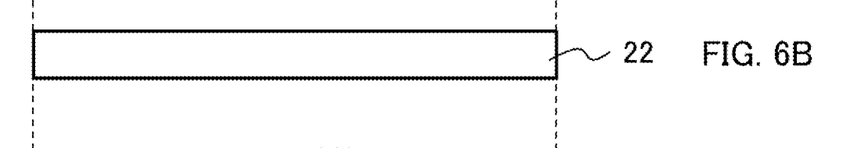
Figure 6C:
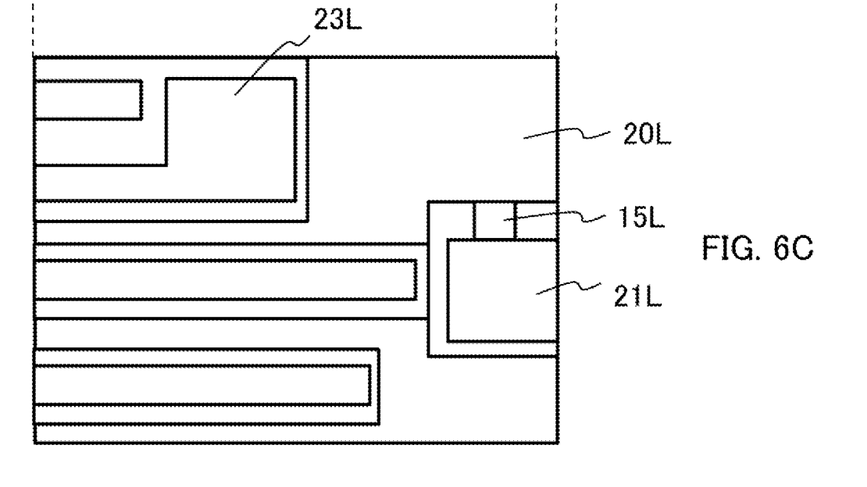

It is noted that, in Embodiment 1, for the light-emitting-element pair 18a and the light-emitting-element pair 18b, two types of mounting boards are required, one of which corresponds to the mounting boards $22_0$, $22_2$ on which the light-emitting elements are each formed on the left side viewed from the emission direction of the optical signal, and the other of which corresponds to the mounting boards $22_1$, $22_3$ on which the light-emitting elements are each formed on the right side viewed from the emission direction of the optical signal. In this regard, in Embodiment 1, a mounting board 22 shown in FIG. 6A to FIG. 6C may be used. FIG. 6A is a top view (front surface), FIG. 6B shows a side surface, and FIG. 6C is a bottom view (back surface). As shown in FIG. 6A to FIG. 6C, on the front surface and the back surface of the mounting board 22, terminal resistors 15R, 15L, light-emitting-element installation regions 20R, 20L, capacitor installation regions 21R, 21L and monitor PD installation regions 22R, 22L, are respectively formed at positions that may be symmetrical about an emission direction of the optical signal.

When the mounting board 22 is to be used as the mounting board $22_0$ ($22_2$), the back side thereof is utilized and thus the light-emitting element $1_0$ ($1_2$) is installed in the light-emitting-element installation region 20L, the capacitor $16_0$ ($16_2$) is installed in the capacitor installation region 21L, and the monitor PD $14_0$ ($14_2$) is installed in the monitor PD installation region 22L. Further, when the mounting board 22 is to be used as the mounting board $22_1$ ($22_3$), the front side thereof is utilized and thus the light-emitting element $1_1$ ($1_3$) is installed in the light-emitting-element installation region 20R, the capacitor $16_1$ ($16_3$) is installed in the capacitor installation region 21R, and the monitor PD $14_1$ ($14_3$) is installed in the monitor PD installation region 22R.

Accordingly, using the mounting boards 22 of one type, it is possible to constitute the pair so that the light-emitting elements are located closer to each other. This makes it possible to achieve reduction in size of the optical multiplexer and reduction in size of the integrated optical module. In addition, since the mounting boards of the light-emitting elements constituting a pair can be of the same type, it is possible to reduce the types of members, to thereby increase the number of the mounting boards per one type. This makes it possible to reduce the manufacturing cost of the mounting board and thus to achieve cost reduction.

Figure 7:
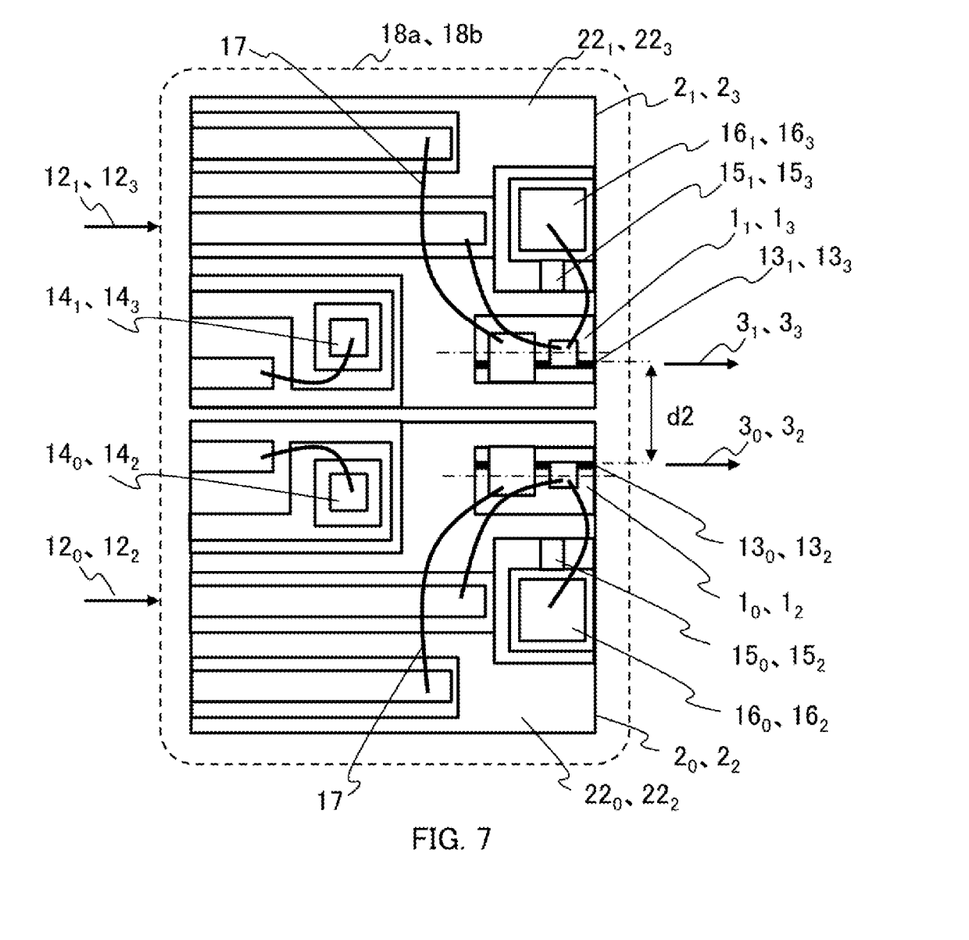
FIG. 7 is a plan view showing another configuration of mounting sections in the integrated optical module according to Embodiment 1.

FIG. 7 is a plan view showing another configuration of the mounting sections in the integrated optical module 101 according to Embodiment 1. As shown in FIG. 7, in the light-emitting-element pair 18a of the integrated optical module 101, the light-emitting spot $13_0$ is implemented in the light-emitting element $1_0$ so as to be displaced from its center in a width direction across the emission direction of the optical signal $3_0$, toward the light-emitting spot $13_1$; and the light-emitting spot $13_1$ is implemented in the light-emitting element $1_1$ so as to be displaced from its center in a width direction across the emission direction of the optical signal $3_1$, toward the light-emitting spot $13_0$. Likewise, in the light-emitting-element pair 18b, the light-emitting spot $13_2$ is implemented in the light-emitting element $1_2$ so as to be displaced from its center in a width direction across the emission direction of the optical signal $3_2$, toward the light-emitting spot $13_3$; and the light-emitting spot $13_3$ is implemented in the light-emitting element $1_3$ so as to be displaced from its center in a width direction across the emission direction of the optical signal $3_3$, toward the light-emitting spot $13_2$.

Accordingly, a distance between the light-emitting spot $13_0$ and the light-emitting spot $13_1$ of the light-emitting element $1_0$ and the light-emitting element $1_1$ that constitute the light-emitting-element pair 18a, as well as a distance between the light-emitting spot $13_2$ and the light-emitting spot $13_3$ of the light-emitting element $1_2$ and the light-emitting element $1_3$ that constitute the light-emitting-element pair 18b, is given as d2, provided that d2<d1, so that it is possible to further reduce the size of the optical multiplexer.

Figure 8:
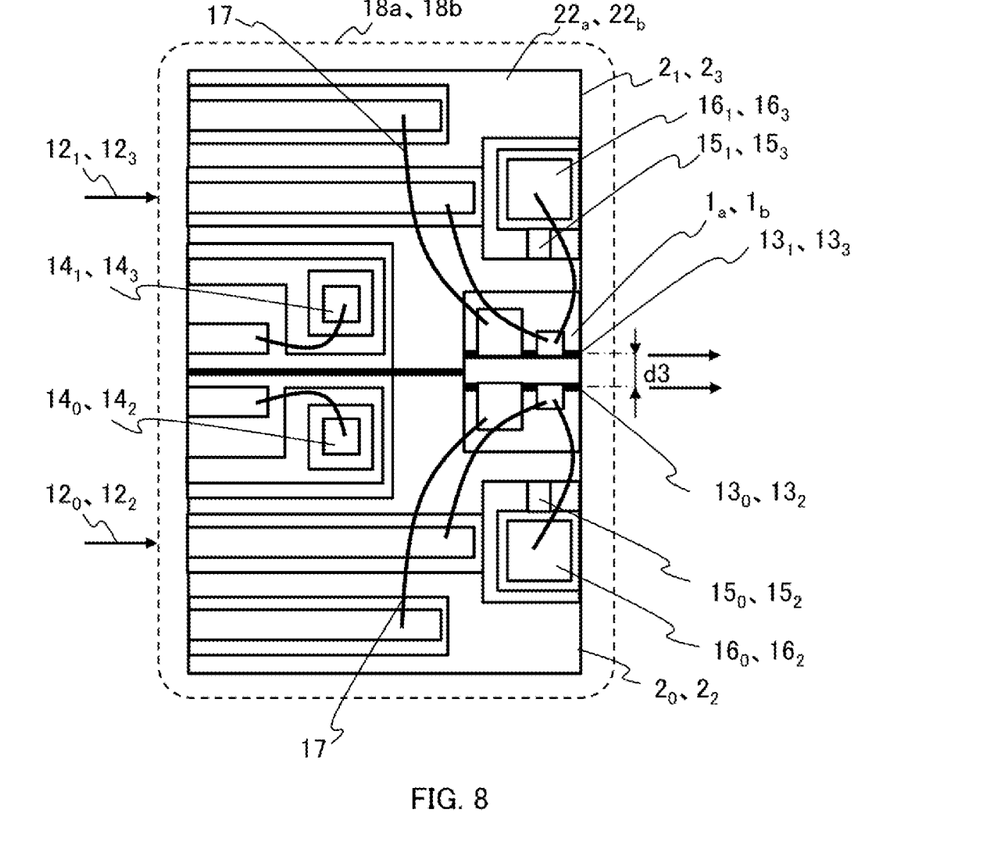
FIG. 8 is a plan view showing another configuration of mounting sections in the integrated optical module according to Embodiment 1.

FIG. 8 is also a plan view showing another configuration of the mounting sections in the integrated optical module 101 according to Embodiment 1. As shown in FIG. 8, a mounting board 22a is formed on which: a single light-emitting element 1a with integrated two light-emitting spots $13_0$, $13_1$, serving as the light-emitting-element pair 18a of the integrated optical module 101, for emitting optical signals with different wavelengths; the monitor PDs $14_0$, $14_1$; and the capacitors $16_0$, $16_1$; are installed. Likewise, a mounting board 22b is formed on which: a single light-emitting element 1b with integrated two light-emitting spots $13_2$, $13_3$, serving as the light-emitting-element pair 18b, for emitting optical signals with different wavelengths; the monitor PDs $14_2$, $14_3$; and the capacitors $16_2$, $16_3$; are installed.

Accordingly, a distance between the light-emitting spot $13_0$ and the light-emitting spot $13_1$ of the light-emitting element 1a that constitutes the light-emitting-element pair 18a, as well as a distance between the light-emitting spot $13_2$ and the light-emitting spot $13_3$ of the light-emitting element 1b that constitutes the light-emitting-element pair 18b, is given as d3, provided that d3<d2<d1, so that it is possible to still further reduce the size of the optical multiplexer.

As described above, the integrated optical module 101 according to Embodiment 1 comprises: the mounting section $2_3$ having the light-emitting element $1_3$ for emitting from the light-emitting spot $13_3$, the optical signal $3_3$; the mounting section $2_2$ arranged alongside the mounting section $2_3$ and having the light-emitting element $1_2$ for emitting from the light-emitting spot $13_2$, the optical signal $3_2$ whose wavelength is different from that of the optical signal $3_3$; the collimating lens $4_3$ for transforming the optical signal $3_3$ emitted from the light-emitting spot $13_3$, into parallel light; the collimating lens $4_2$ for transforming the optical signal $3_2$ emitted from the light-emitting spot $13_2$, into parallel light; and the optical multiplexer 5 having the filter $9_3$ for transmitting therethrough only the wavelength of the optical signal $3_3$ transformed into parallel light by the collimating lens $4_3$; the mirror 10 for reflecting the optical signal $3_3$ transmitted through the filter $9_3$, and the filter $9_2$ arranged alongside the filter $9_3$, for transmitting therethrough only the wavelength of the optical signal $3_2$ transformed into parallel light by the collimating lens $4_2$, and for reflecting the optical signal $3_3$ reflected by the mirror 10 and multiplexing it with the transmitted optical signal $3_2$;

wherein the light-emitting element $1_3$ is mounted in the mounting section $2_3$ so as to be displaced from its center in a width direction across the emission direction of the optical signal $3_3$, toward the light-emitting element $1_2$; and the light-emitting element $1_2$ is mounted in the mounting section $2_2$ so as to be displaced from its center in a width direction across the emission direction of the optical signal $3_2$, toward the light-emitting element $1_3$.

Thus, the adjacent light-emitting elements are paired and mounted on their respective mounting boards so as to be closer to each other, so that it is possible to reduce the interval between the light-emitting elements constituting a pair.

In another aspect, the integrated optical module further comprises: the mounting section $2_1$ and the mounting section $2_0$ which are formed as the light-emitting-element pair 18a in a manner corresponding to the light-emitting-element pair 18b formed of the mounting section $2_3$ and the mounting section $2_2$, and which are arranged alongside each other in this order on an opposite side of the mounting section $2_2$ relative to the mounting section $2_3$; the collimating lens $4_1$ for transforming the optical signal $3_1$ emitted from the light-emitting spot $13_1$ in the mounting section $2_1$, into parallel light; the collimating lens $4_0$ for transforming the optical signal $3_0$ emitted from the light-emitting spot $13_0$ in the mounting section $2_0$, into parallel light; the filter $9_1$ and the filter $9_0$ which are matched to the wavelengths of the optical signal $3_1$ and the optical signal $3_0$ from the light-emitting-element pair 18a, respectively, and which are arranged alongside each other in the optical multiplexer 5 in a manner corresponding to the filter $9_3$ and the filter $9_2$; and the back-side mirror 19 for reflecting between the filter $9_2$ and the filter $9_1$, a multiplexed wave of the optical signal $3_3$ and the optical signal $3_2$;

wherein, assuming that a distance between the light-emitting spot $13_3$ in the mounting section $2_3$ and the light-emitting spot $13_2$ in the mounting section $2_2$ is d1, a distance between the light-emitting spot $13_2$ in the mounting section $2_2$ and the light-emitting spot $13_1$ in the mounting section $2_1$ is nd1 (n denotes an integer of 2 or more).

Thus, since the length of the holder in the optical multiplexer is given proportionally to the distance between the optical signals, when the adjacent light-emitting elements are paired and mounted on their respective mounting boards so as to be closer to each other, it becomes possible to reduce the size of the optical multiplexer. Thus, it is also possible to achieve reduction in size of the integrated optical module in which the optical multiplexer is incorporated.

In another aspect, the light-emitting spot $13_3$ is implemented in the light-emitting element $1_3$ so as to be displaced from its center in a width direction across the emission direction of the optical signal $3_3$, toward the light-emitting spot $13_2$, and the light-emitting spot $13_2$ is implemented in the light-emitting element $1_2$ so as to be displaced from its center in a width direction across the emission direction of the optical signal $3_2$, toward the light-emitting spot $13_3$.

Thus, the distance between the light-emitting spots can be made shorter, so that it is possible to achieve further reduction in size of the optical multiplexer and thus in size of the integrated optical module.

In another aspect, the mounting section $2_3$ and the mounting section $2_2$ are integrated with each other so that the light-emitting spot $13_3$ and the light-emitting spot $13_2$ are implemented side by side. Thus, the distance between the light-emitting spots can be made much shorter, so that it is possible to achieve further reduction in size of the optical multiplexer and thus in size of the integrated optical module.

In another aspect, the mounting section $2_3$ and the mounting section $2_2$ are each formed of a mounting board, on both surfaces of which an installation region for the light-emitting element $1_3$ and an installation region for the light-emitting element $1_2$ are respectively provided. Thus, since the mounting boards of the light-emitting elements constituting the light-emitting element pair can be of the same type, it is possible to reduce the types of members, to thereby increase the number of the mounting boards per one type. This makes it possible to reduce the manufacturing cost of the mounting board and thus to achieve cost reduction.

Embodiment 2

In Embodiment 1, a glass substrate on which a dielectric multi-layer film is vapor-deposited is used as each of the mirrors 10, 19, whereas in Embodiment 2, description will be made about a case where the dielectric multi-layer film is vapor-deposited on the holder.

Figure 9:
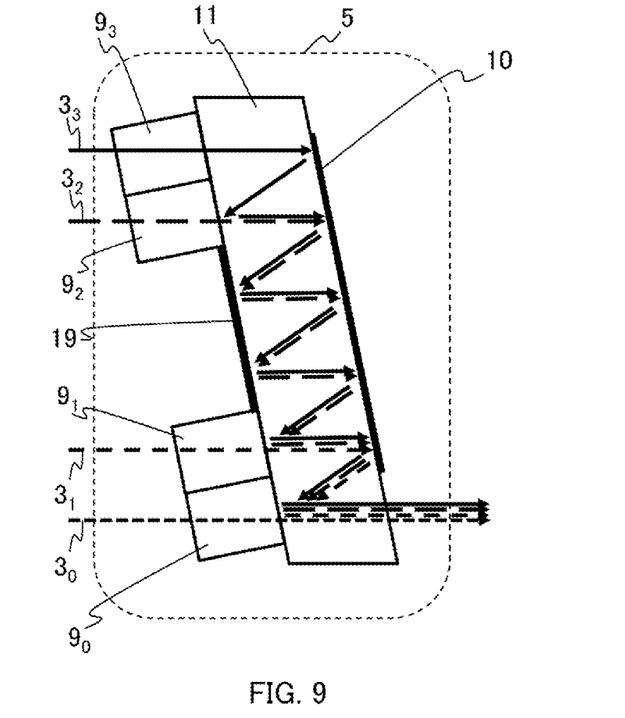
FIG. 9 is a plan view showing a configuration of an optical multiplexer in an integrated optical module according to Embodiment 2.

FIG. 9 is a plan view showing a configuration of an optical multiplexer in an integrated optical module according to Embodiment 2. As shown in FIG. 9, in the integrated optical module according to Embodiment 2, the mirror 10 and the mirror 19 are each formed in such a manner that the dielectric multi-layer film is vapor-deposited directly on the glass-made holder 11 instead of the glass substrate used in Embodiment 1 on which the dielectric multi-layer film is to be vapor-deposited. The other configuration of the integrated optical module according Embodiment 2 is similar to that of the integrated optical module 101 of Embodiment 1, so that reference numerals that are the same as those in FIG. 2 are given to the corresponding parts and description thereof is omitted here.

As described above, in the integrated optical module according to Embodiment 2, the glass-made holder 11 provided with the dielectric multi-layer films that are vapor-deposited directly on that holder in its locations where the mirrors are to be fixed, is used. This makes it possible not only to achieve an effect described in Embodiment 1, but also to eliminate a step of mounting the mirror and to reduce the number of components of the optical multiplexer, because of the mirror formation directly on the holder. Thus, it is possible to achieve cost reduction.

Embodiment 3

In Embodiment 1, a glass substrate on which a dielectric multi-layer film is vapor-deposited is used as the mirror 19, whereas in Embodiment 3, description will be made about a case where a large-sized filter is instead used.

Figure 10:
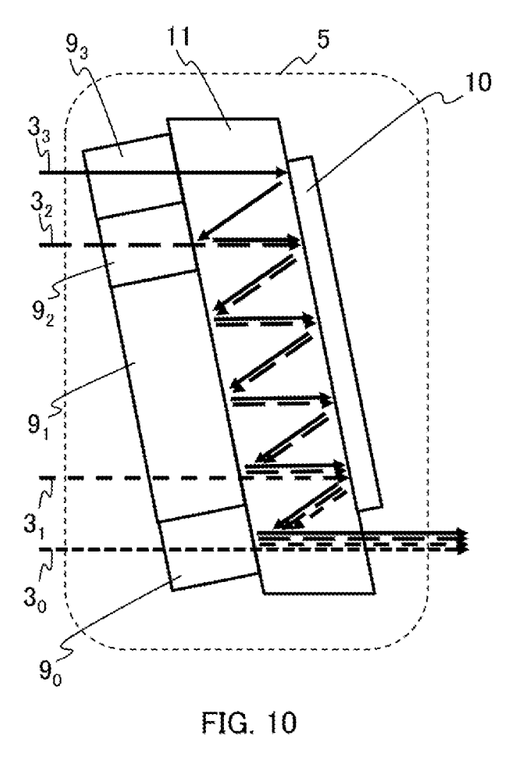
FIG. 10 is a plan view showing a configuration of an optical multiplexer in an integrated optical module according to Embodiment 3.

FIG. 10 is a plan view showing a configuration of an optical multiplexer in an integrated optical module according to Embodiment 3. As shown in FIG. 10, in the integrated optical module according to Embodiment 3, such a filter $9_1$ is formed whose size is expanded so as to cover the location of the holder 11 where the mirror 19 is to be fixed in Embodiment 1, and which serves also as the mirror 19. Note that a filter $9_2$ like this may be used instead of the filter $9_1$. The other configuration of the integrated optical module according Embodiment 3 is similar to that of the integrated optical module 101 of Embodiment 1, so that reference numerals that are the same as those in FIG. 2 are given to the corresponding parts and description thereof is omitted here.

As described above, in the integrated optical module according to Embodiment 3, the mirror 19 is established in such a manner that the filter $9_1$ or the filter $9_2$ covers the holder 11 up to the location thereof where the mirror 19 is to be fixed, to thereby cause reflection. This makes it possible not only to achieve an effect described in Embodiment 1, but also to eliminate a step of mounting the mirror and to reduce the number of components of the optical multiplexer. Thus, it is possible to achieve cost reduction.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where at least one configuration element is added or omitted; and furthermore, where at least one configuration element is extracted and combined with a configuration element of another embodiment.

DESCRIPTION OF REFERENCE NUMERALS AND SIGNS $1i$ ($1_0$, $1_1$, $1_2$, $1_3$): light-emitting element, $2i$ ($2_0$, $2_1$, $2_2$, $2_3$): mounting section, $3i$ ($3_0$, $3_1$, $3_2$, $3_3$): optical signal, $4i$ ($4_0$, $4_1$, $4_2$, $4_3$): collimating lens, $9i$ ($9_0$, $9_1$, $9_2$, $9_3$): filter, 10: mirror, 11: holder, $13i$ ($13_0$, $13_1$, $13_2$, $13_3$): light-emitting spot, $22i$ ($22_0$, $22_1$, $22_2$, $22_3$): mounting board, 101: integrated optical module.

The invention claimed is:
1. An integrated optical module, comprising:
a first light-emitting-element pair which is formed of a first mounting section having a first light-emitting element for emitting from a first light-emitting spot thereof, a first optical signal, and a second mounting section arranged alongside the first mounting section and having a second light-emitting element for emitting from a second light-emitting spot thereof, a second optical signal whose wavelength is different from that of the first optical signal;
a second light-emitting-element pair which is formed of a third mounting section having a third light-emitting element for emitting from a third light-emitting spot thereof, a third optical signal whose wavelength is different to those of the first and second optical signals, and a fourth mounting section arranged alongside the third mounting section and having a fourth light-emitting element for emitting from a fourth light-emitting spot thereof, a fourth optical signal whose wavelength is different from those of the first to third optical signals;
a first collimating lens for transforming the first optical signal emitted from the first light-emitting spot, into parallel light;
a second collimating lens for transforming the second optical signal emitted from the second light-emitting spot, into parallel light;

a third collimating lens for transforming the third optical signal emitted from the third light-emitting spot, into parallel light;

a fourth collimating lens for transforming the fourth optical signal emitted from the fourth light-emitting spot, into parallel light;

an optical multiplex section having a first filter for transmitting therethrough only the wavelength of the first optical signal transformed into parallel light by the first collimating lens; a front-side mirror for reflecting the first optical signal transmitted through the first filter; a second filter arranged alongside the first filter, for transmitting therethrough only the wavelength of the second optical signal transformed into parallel light by the second collimating lens, and for reflecting the first optical signal reflected by the front-side mirror and multiplexing it with the transmitted second optical signal; a back-side mirror for reflecting again the first and second optical signals reflected by the front-side mirror, toward the front-side mirror; a third filter for transmitting therethrough only the wavelength of the third optical signal transformed into parallel light by the third collimating lens; and a fourth filter arranged alongside the third filter, for transmitting therethrough only the wavelength of the fourth optical signal transformed into parallel light by the fourth collimating lens, and for reflecting the third optical signal reflected by the front-side mirror and multiplexing it with the transmitted fourth optical signal;

wherein, assuming that a distance between the first light-emitting spot in the first mounting section and the second light-emitting spot in the second mounting section and a distance between the third light-emitting spot in the third mounting section and the fourth light-emitting spot in the fourth mounting section, are each d, a distance between the second light-emitting spot in the second mounting section and the third light-emitting spot in the third mounting section is nd (n denotes an integer of 2 or more);

wherein the first light-emitting element is mounted in the first mounting section so as to be displaced from its center in a width direction across an emission direction of the first optical signal, toward the second light-emitting element; and the second light-emitting element is mounted in the second mounting section so as to be displaced from its center in a width direction across an emission direction of the second optical signal, toward the first light-emitting element; and wherein the third light-emitting element is mounted in the third mounting section so as to be displaced from its center in a width direction across an emission direction of the third optical signal, toward the fourth light-emitting element; and the fourth light-emitting element is mounted in the fourth mounting section so as to be displaced from its center in a width direction across an emission direction of the fourth optical signal, toward the third light-emitting element.

2. The integrated optical module of claim 1, wherein the first light-emitting spot is implemented in the first light-emitting element so as to be displaced from its center in a width direction across the emission direction of the first optical signal, toward the second light-emitting spot; and the second light-emitting spot is implemented in the second light-emitting element so as to be displaced from its center in a width direction across the emission direction of the second optical signal, toward the first light-emitting spot; and wherein the third light-emitting spot is implemented in the third light-emitting element so as to be displaced from its center in a width direction across the emission direction of the third optical signal, toward the fourth light-emitting spot; and the fourth light-emitting spot is implemented in the fourth light-emitting element so as to be displaced from its center in a width direction across the emission direction of the fourth optical signal, toward the third light-emitting spot.

3. The integrated optical module of claim 1, wherein the first mounting section and the second mounting section are each formed of a mounting board, on both surfaces of which an installation region for the first light-emitting element and an installation region for the second light-emitting element are respectively and symmetrically provided; and wherein the third mounting section and the fourth mounting section are each formed of a mounting board, on both surfaces of which an installation region for the third light-emitting element and an installation region for the fourth light-emitting element are respectively and symmetrically provided.

4. The integrated optical module of claim 1, wherein the first mounting section and the second mounting section as well as the third mounting section and the fourth mounting section, are integrated with each other so that the first light-emitting spot and the second light-emitting spot as well as the third light-emitting spot and the fourth light-emitting spot, are implemented side by side.

5. The integrated optical module of claim 1, wherein the front-side mirror and the back-side mirror are composed of dielectric multi-layer films that are vapor-deposited directly on a glass-made holder in its respective locations where the front-side mirror and the back-side mirror are to be provided.

6. The integrated optical module of claim 5, wherein the back-side mirror is established in such a manner that the second filter or the third filter also covers a location where the back-side mirror is to be provided, to thereby cause reflection.

7. The integrated optical module of claim 1, wherein the back-side mirror is established in such a manner that the second filter or the third filter also covers a location where the back-side mirror is to be provided, to thereby cause reflection.

* * * * *